United States Patent
Yamashita

(10) Patent No.: US 9,941,292 B2
(45) Date of Patent: Apr. 10, 2018

(54) SEMICONDUCTOR MEMORY DEVICE AND METHOD FOR MANUFACTURING SAME

(71) Applicant: Toshiba Memory Corporation, Minato-ku (JP)

(72) Inventor: Hiroki Yamashita, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/267,946

(22) Filed: Sep. 16, 2016

(65) Prior Publication Data

US 2017/0263612 A1 Sep. 14, 2017

Related U.S. Application Data

(60) Provisional application No. 62/306,257, filed on Mar. 10, 2016.

(51) Int. Cl.
| | |
|---|---|
| *H01L 27/115* | (2017.01) |
| *H01L 27/11556* | (2017.01) |
| *H01L 27/11582* | (2017.01) |
| *H01L 27/11531* | (2017.01) |
| *H01L 27/11573* | (2017.01) |

(52) U.S. Cl.
CPC ....... *H01L 27/115* (2013.01); *H01L 27/11531* (2013.01); *H01L 27/11556* (2013.01); *H01L 27/11573* (2013.01); *H01L 27/11582* (2013.01)

(58) Field of Classification Search
CPC ............ H01L 27/115; H01L 27/11531; H01L 27/11556; H01L 27/11573; H01L 27/11582

USPC ................................................. 257/324, 315
See application file for complete search history.

(56) References Cited

U.S. PATENT DOCUMENTS

| | | | | |
|---|---|---|---|---|
| 6,097,611 | A * | 8/2000 | Samaras | H01L 23/49816 174/16.3 |
| 8,786,003 | B2 | 7/2014 | Iwase et al. | |
| 9,040,374 | B2 | 5/2015 | Lee et al. | |
| 2008/0061349 | A1* | 3/2008 | Arai | H01L 27/105 257/315 |
| 2013/0270625 | A1* | 10/2013 | Jang | H01L 29/7926 257/324 |
| 2014/0061754 | A1 | 3/2014 | Murakami | |

FOREIGN PATENT DOCUMENTS

| | | |
|---|---|---|
| JP | 2013-55142 | 3/2013 |
| JP | 2014-45128 | 3/2014 |

* cited by examiner

*Primary Examiner* — Cuong Q Nguyen
*Assistant Examiner* — Tong-Ho Kim
(74) *Attorney, Agent, or Firm* — Oblon, McClelland, Maier & Neustadt, L.L.P.

(57) ABSTRACT

A semiconductor memory device includes a plurality of first electrode layers stacked in a first direction; a semiconductor layer extending in the first direction in the plurality of first electrode layers; a first insulating layer extending in the first direction along the semiconductor layer between the semiconductor layer and each of the plurality of first electrode layers; a second insulating layer covering the periphery of the plurality of first electrode layers; a resistive body provided on the second insulating layer; and a third insulating layer provided between the resistive body and the second insulating layer, the third insulating layer including the same material as the material of the first insulating layer.

9 Claims, 16 Drawing Sheets

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/306,257 filed on Mar. 10, 2016; the entire contents of which are incorporated herein by reference.

FIELD

Embodiments are generally related to a semiconductor memory device and a method for manufacturing the same.

BACKGROUND

A semiconductor memory device is under developing, which includes three-dimensionally disposed memory cells. For example, a NAND-type semiconductor memory device has a memory cell array that includes a plurality of control electrodes and semiconductor channels extending through the control electrodes. Furthermore, driving circuits, such as a row decoder and a sense amplifier and like, and a peripheral circuit electrically connected thereto are provided around the memory cell array. In order to enlarge the memory capacity of the semiconductor memory device, it is important to enlarge the occupancy of the memory cell array by effectively utilizing a pace of the chip surface in the layout of such a peripheral circuit. Further, it is also important to rationalize the formation process of the peripheral circuit so as to reduce the manufacturing cost.

DETAILED DESCRIPTION

Figure 1:
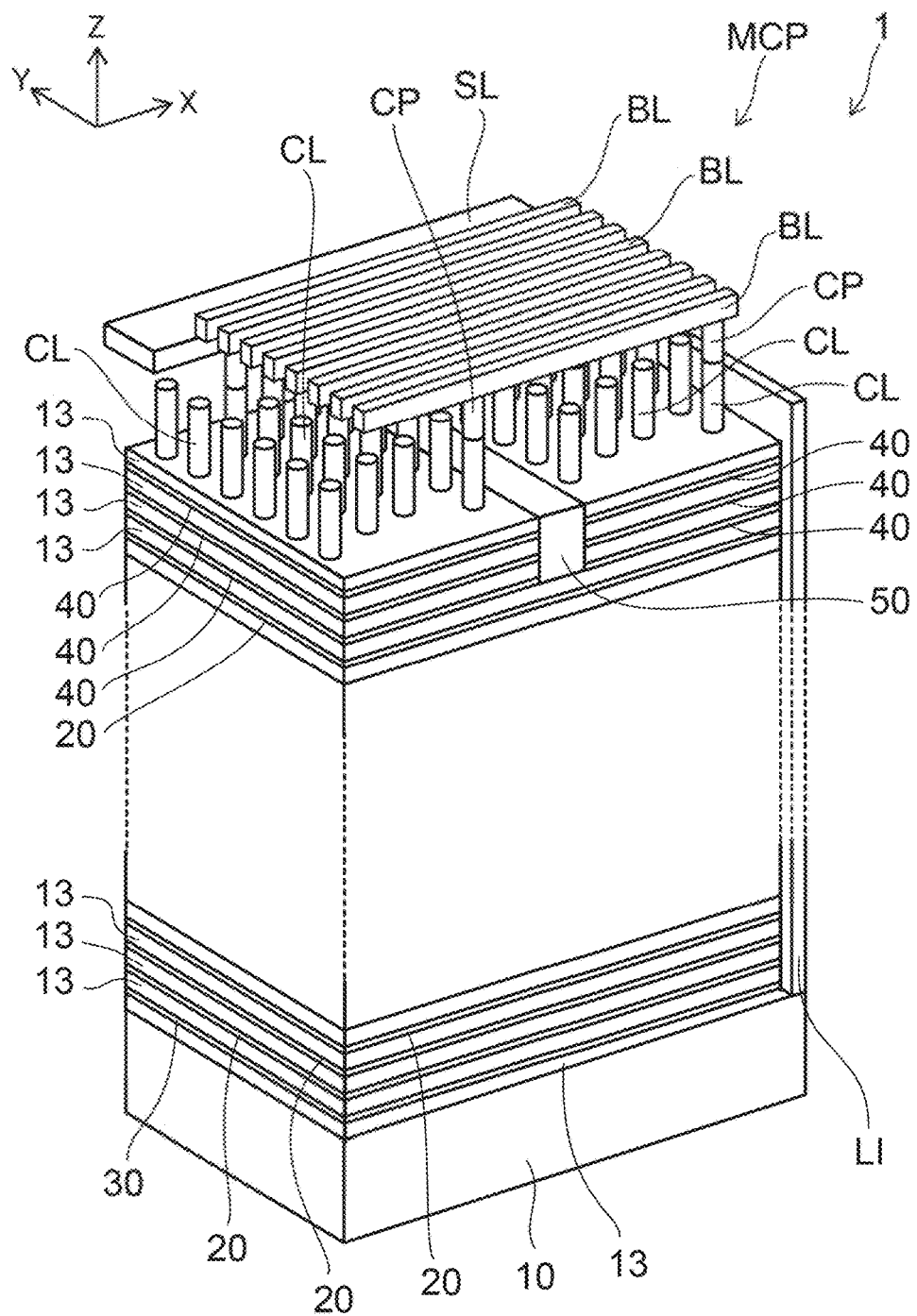
FIG. 1 is a perspective view schematically showing a semiconductor memory device according to an embodiment.

According to one embodiment, a semiconductor memory device includes a plurality of first electrode layers stacked in a first direction; a semiconductor layer extending in the first direction in the plurality of first electrode layers; a first insulating layer extending in the first direction along the semiconductor layer between the semiconductor layer and each of the plurality of first electrode layers; a second insulating layer covering the periphery of the plurality of first electrode layers; a resistive body provided on the second insulating layer; and a third insulating layer provided between the resistive body and the second insulating layer, the third insulating layer including the same material as the material of the first insulating layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a perspective view schematically showing a memory cell portion MCP of a semiconductor memory device 1 according to an embodiment. The semiconductor memory device 1 is, for example, a NAND type non-volatile memory, which includes three-dimensionally disposed memory cells (see FIG. 3A).

As shown in FIG. 1, the semiconductor memory device 1 includes a conductive layer (hereinafter referred to as a source layer 10), and a plurality of electrode layers (hereinafter referred to as word lines 20, a selection gate 30 and a selection gate 40 respectively) that are stacked on the source layer 10.

The source layer 10 is, for example, a P-type well provided in a silicon substrate (not shown). Alternatively, the source layer 10 may be a silicon layer provided on a silicon substrate via an interlayer insulating layer (not shown). The word lines 20, the selection gates 30 and 40 are, for example, a metal layer including tungsten (W).

The selection gate 30 is provided on the source layer 10. The word lines 20 are stacked on the selection gate 30. The word lines 20 and the selection gate 30 are flatly broadened respectively, and stacked on a surface of the source layer 10. The word lines 20 are stacked, for example, in the Z-direction. Insulating layers 13 are provided respectively between the source layer 10 and the selection gate 30, between the selection gate 30 and the word lines 20, and between adjacent word lines 20 in the Z-direction. The insulating layers 13 are, for example, silicon oxide layers.

The selection gate 40 is provided on a plurality of stacked word lines 20. Moreover, a plurality of selection gates 40 are stacked on the word lines 20 as shown in FIG. 1. Insulating layers 13 are also provided respectively between the word lines 20 and the selection gates 40, and between adjacent selection gates 40 in the Z-direction. In this example, the selection gates 40 are divided by an insulating layer 50 on the plurality of stacked word lines 20. The insulating layer 50 extends, for example, in the Y-direction and the Z-direction.

The semiconductor memory device 1 further includes a plurality of columnar bodies CL. The columnar bodies CL extend in the Z-direction through the word lines 20, selection gates 30 and 40. The columnar bodies CL include semiconductor layers 60 respectively. The semiconductor layers 60 extend in the Z-direction in the columnar bodies CL.

The semiconductor memory device 1 further includes a plurality of bit lines BL provided above the selection gates 40, and a source line SL. The semiconductor layers 60 provided in the columnar bodies CL are electrically connected to the bit lines BL respectively via contact plugs CP. The source line SL is electrically connected to the source layer 10 via a source contact body LI. As shown in FIG. 1, the source contact body LI extends in the Y-direction and the Z-direction along lateral surfaces of the word lines 20, selection gates 30 and 40.

It should be noted that insulating layers 19 and 23 (see FIG. 3A) provided between the selection gates 40 and the bit lines BL are omitted in FIG. 1 for convenience in showing the structure of the semiconductor memory device 1.

Figure 2A:
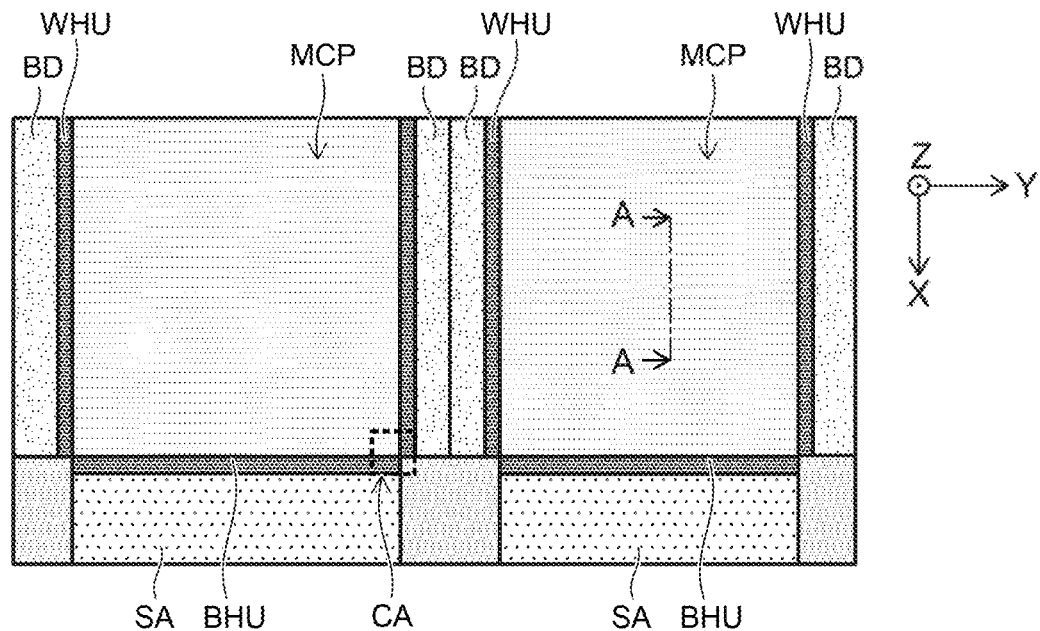
FIGS. 2A and 2B are schematic views showing a configuration of the semiconductor memory device according to the embodiment.
Figure 2B:
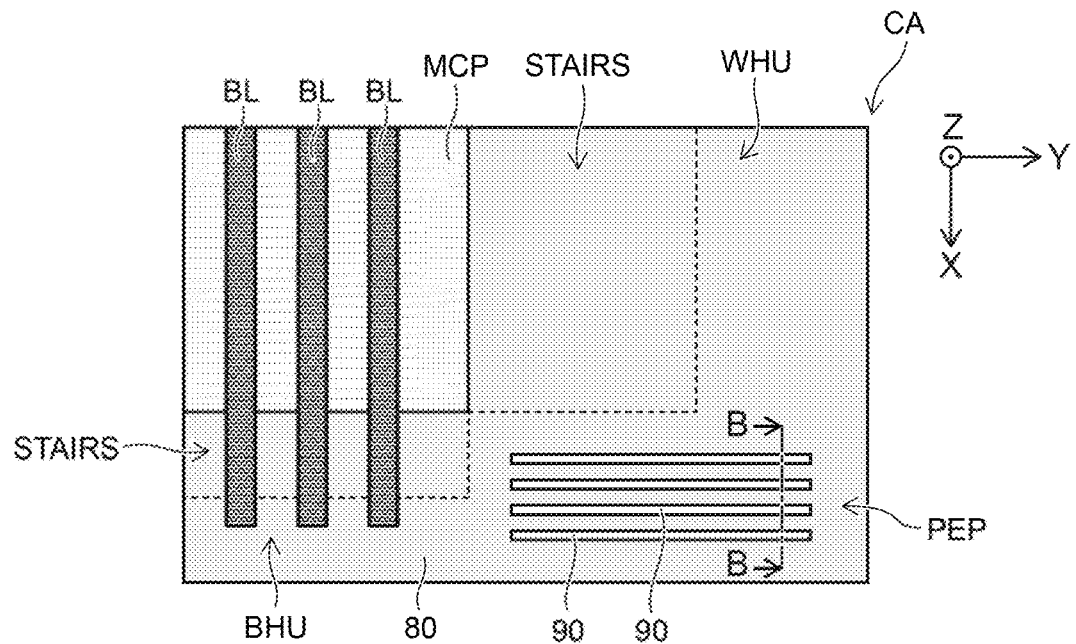

FIG. 2A is a plan view schematically showing an arrangement of the composing elements in the chip surface of the semiconductor memory device 1. FIG. 2B is a magnified schematic view of the region CA shown in FIG. 2A.

As shown in FIG. 2A, the semiconductor memory device includes the memory cell portion MCP, and a sense amplifier SA and block decoders BD disposed around the memory cell portion MCP. The sense amplifier SA and the block decoders BD configure a driving circuit of the memory cell portion MCP. The sense amplifier SA is provided, for example, in the extended direction of the bit lines BL (the X-direction) in the view from the memory cell portion MCP. The block decoders BD are provided, for example, in the extended direction of the word lines crossing the bit lines BL (the Y-direction; see FIG. 1) in the view from the memory cell portion MCP. A bit line hookup portion BHU is provided between the memory cell portion MCP and the sense amplifier SA. In the bit line hookup portion BHU, the bit lines BL are electrically connected respectively to interconnections joining the sense amplifier. A word line hookup portion WHU is provided between the memory cell portion MCP and a block decoder BD. In the word line hookup portion WHP, the word lines 20 stacked in the Z-direction are electrically connected respectively to interconnections joining the block decoder BD.

As shown in FIG. 2B, the semiconductor memory device 1 further includes resistive bodies 90 that are provided on an insulating layer 80, for example, in a peripheral portion PEP around the memory cell portion MCP. The resistive bodies 90 are, for example, electrically connected to peripheral circuits (not shown) of the sense amplifier SA and the block decoders BD, and acts as the resistance elements thereof. The insulating layer 80 covers, for example, the end portions of the word lines 20 that are formed into stairs in the periphery of the memory cell portion MCP (see FIG. 5). The insulating layer 80 may be provided so as to surround the memory cell portion MCP.

The resistive bodies 90 is provided, for example, in the peripheral portion PEP that locates adjacent to at least one of four corners of the memory cell portion MCP. That is, the resistive bodies 90 is provided at the position where the resistive bodies 90 do not overlap with a peripheral region positioned in the extended direction of the bit lines BL in the view from the memory cell portion MCP, and also at the position where the resistive bodies 90 do not overlap with another peripheral region positioned in the extended direction of the word lines 20 that crosses the bit lines BL. Moreover, the resistive bodies 90 is provided at the position where the resistive bodies 90 do not overlap with the end portions of the word lines 20 that are formed into stairs in the periphery of the memory cell portion MCP.

Thus, the resistive bodies 90 are disposed, for example, in the peripheral portion PEP around the memory cell portion MCP, where no circuit elements such as the sense amplifier SA, the block decoders BD and the hookup portions are provided. Thereby, it is possible to enlarge the memory capacity of the semiconductor memory device 1 by effectively utilizing the chip surface thereof and relatively enlarging the occupancy area of the memory cell portion MCP.

Figure 3A:
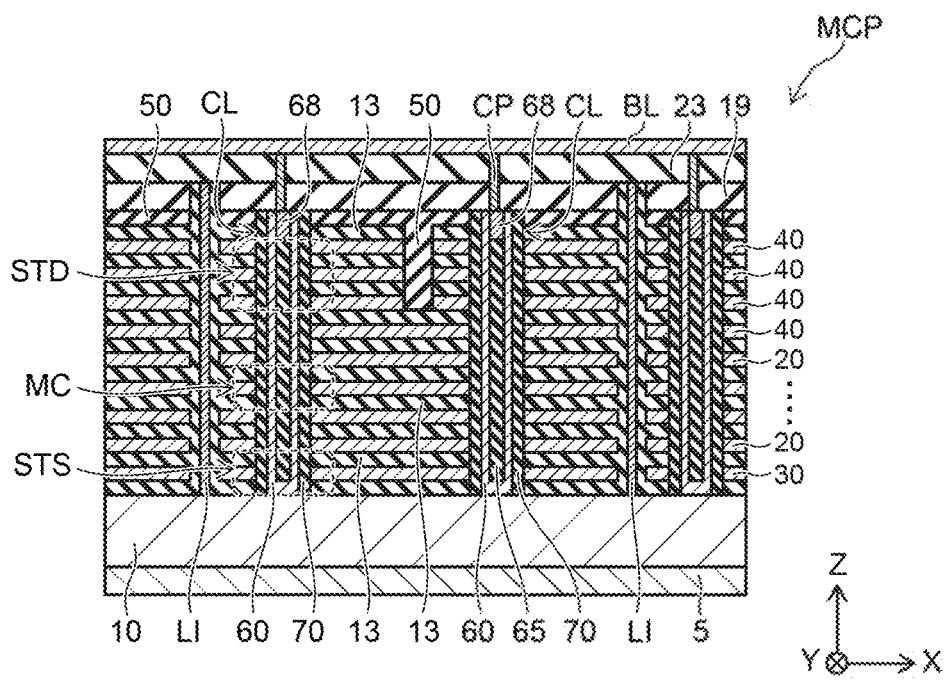
FIGS. 3A and 3B are schematic cross-sectional views showing the semiconductor memory device according to the embodiment.
Figure 3B:
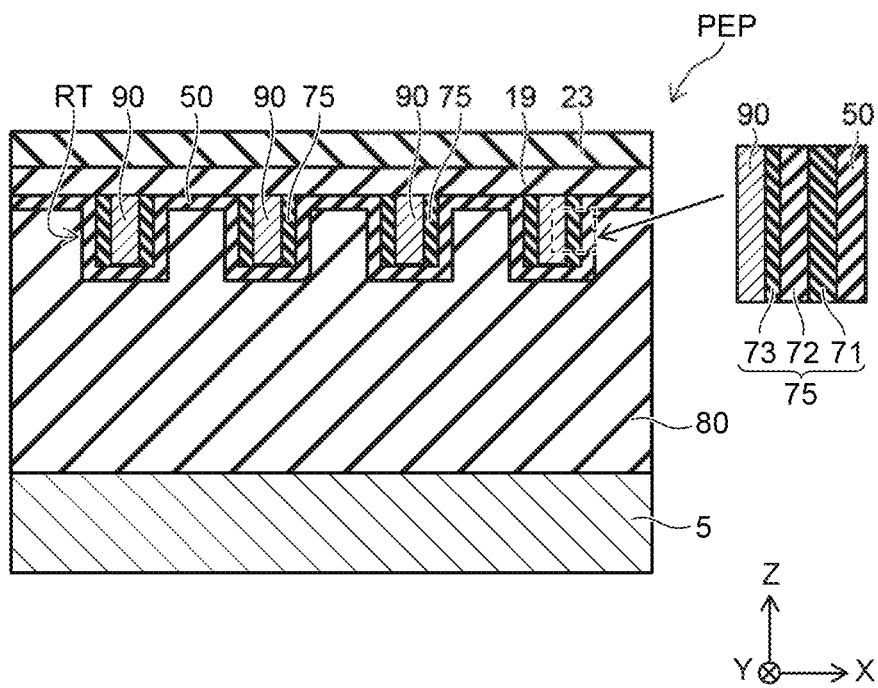

FIGS. 3A and 3B are schematic views showing a part of the semiconductor memory device 1 according to the embodiment. FIG. 3A is the schematic view showing the cross-section of the memory cell portion MCP taken along A-A line shown in FIG. 2A. FIG. 3B is the schematic view showing the cross-section of the peripheral portion PEP taken along B-B line shown in FIG. 2B. Hereinafter, with reference to FIGS. 3A and 3B, the structure of the semiconductor memory device 1 will be described in detail.

As shown in FIG. 3A, the semiconductor memory device 1 includes the word lines 20, the selection gates 30, 40 and the columnar bodies CL in the memory cell portion MCP. The word lines 20, the selection gates 30 and 40 are stacked on the source layer 10 that is provided on a top side of a substrate 5. The columnar bodies CL are provided so as to extend in the Z-direction through the word lines 20, the selection gates 30 and 40. The columnar bodies CL each include a semiconductor layer 60 and an insulating layer 70. The semiconductor layer 60 extends in the Z-direction in a columnar body CL. The insulating layer 70 is provided as an outer envelope for the columnar body CL, and extends in the Z-direction along the semiconductor layer 60.

The columnar body CL further includes a core body 65 and a cap layer 68. The core body 65 is provided so as to fill an inside of a memory hole MH, and the semiconductor layer 60 is positioned between the insulating layer 70 and the core body 65. The cap layer 68 is provided on the core body 65, and the semiconductor layer 60 includes a portion positioned between the cap layer 68 and the insulating layer 70. The cap layer 68 has conductivity, and for example, is made of semiconductor. The cap layer 68, for example, makes it easier to connect the semiconductor layer 60 and the contact plug CP.

In the memory cell portion MCP, memory cells MC are provided respectively in the portions where the semiconductor layer 60 extends through the word lines 20. A word line 20 acts as a control gate of a memory cell MC; and the semiconductor layer 60 acts as a channel of the memory cell MC. The insulating layer 70 acts as a charge storage portion at a part positioned between the word line 20 and the semiconductor layer 60.

The insulating layer 70, for example, has so-called ONO structure in which a silicon oxide, a silicon nitride and a silicon oxide are stacked in a direction from the word line 20 to the semiconductor layer 60. Alternatively, the insulating layer 70 may include a conductive body which acts as the floating gate between the word line 20 and the semiconductor body 60.

A selection transistor STS on the source side is provided at a portion where the columnar body CL extends through the selection gate 30. Moreover, a selection transistor STD on the drain side is provided at a portion where the columnar body CL extends through the selection gates 40. The semiconductor layer 60 acts as channels of the selection transistors STS and STD; and the selection gates 30 and 40 act as gate electrodes of the selection transistors STS and STD. Portions of the insulating layer 70 positioned between the semiconductor layer 60 and each selection gate act as gate insulating films.

As shown in FIG. 3B, in the peripheral portion PEP, for example, an insulating layer 80 is provided on the substrate 5. The semiconductor memory device 1 includes the resistive bodies 90 provided on the insulating layer 80. The resistive bodies 90 is disposed in trenches RT provided in the top surface of the insulating layer 80. The resistive bodies 90 includes, for example, conductive semiconductor such as silicon, and have a rectangular parallelepiped shape extending in the Y-direction. The resistive bodies 90 have, for example, a length that provides the prescribed resistive value.

The semiconductor memory device 1 further includes insulating layers 70 and 75 provided between the insulating layer 80 and a resistive body 90. The insulating layer 50 covers the top surface of the insulating layer 80 and the inner surfaces of the trenches RT. The insulating layer 75 is provided, for example, via the insulating layer 50 on a side wall of each trench RT, and positioned between the insulating layer 80 and a lateral surface of the resistive body 90. The insulating layer 75 includes the same material as the insulating layer 70 provided in the columnar body CL. Moreover, the insulating layer 75 has the same stacked structure as the stacked structure of the insulating layer 70.

As shown in FIG. 3B, the insulating layer 75 includes a first layer 71, a second layer 72 and a third layer 73, which are stacked in the lateral direction from the insulating layer 50 to the resistive body 90. The first layer 71 and the third layer 73 are, for example, silicon oxide layers. The second layer 72 is, for example, a silicon nitride layer.

By using the semiconductor as the material of the resistive body 90, it is possible to make the resistive body 90 smaller than a resistive body for which metallic coating is used. Thereby, the chip surface of the semiconductor memory device 1 can be effectively utilized. That is, it is possible to dispose the resistive bodies 90 in the narrow open space between the circuit elements around the memory cell portion MCP.

Next, a manufacturing method of the semiconductor memory device 1 is described with reference to FIGS. 4 to 17. FIGS. 4 to 17 are schematic cross-sectional views sequentially showing a manufacturing process of the semiconductor memory device 1 according to the embodiment.

Figure 4:
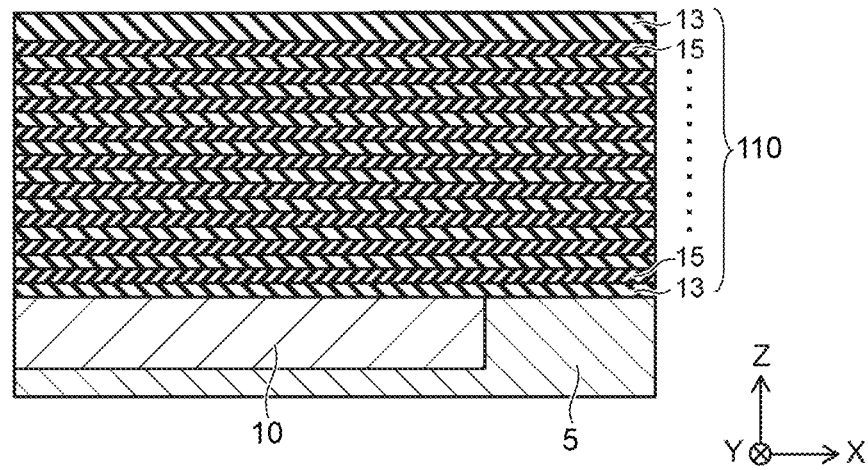
FIGS. 4 to 17 are schematic cross-sectional views showing a manufacturing process of the semiconductor memory device according to the embodiment.

As shown in FIG. 4, a stacked body 110 is formed on the substrate 5. The substrate 5 includes the source layer 10 provided on the top surface thereof. The substrate 5 is, for example, a silicon substrate, and the source layer 10 is, for example, a P-type well on the silicon substrate.

The stacked body 110 includes a plurality of insulating layers 13 and a plurality of insulating layers 15. The insulating layers 13 and the insulating layers 15 are alternately stacked in the Z-direction. The insulating layers 13 are, for example, silicon oxide layers. The insulating layers 15 are, for example, silicon nitride layers. The insulating layers 13 and 15 are formed, for example, using Chemical Vapor Deposition (CVD).

Figure 5:
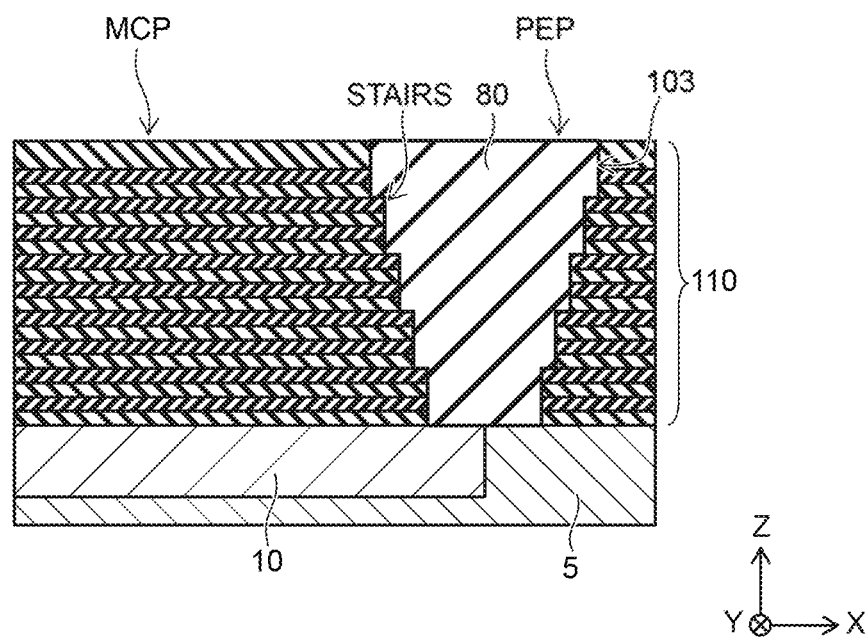

As shown in FIG. 5, the insulating layer 80 is formed in the stacked body 110. The insulating layer 80 is formed, for example, in a groove 103 which divides the stacked body 110. The groove 103 is formed, for example, using wet etching. The insulating layer 80 covers, for example, the periphery of the memory cell portion MCP as shown in FIG. 2. The insulating layer 80 is formed, for example, using CVD.

Figure 6A:
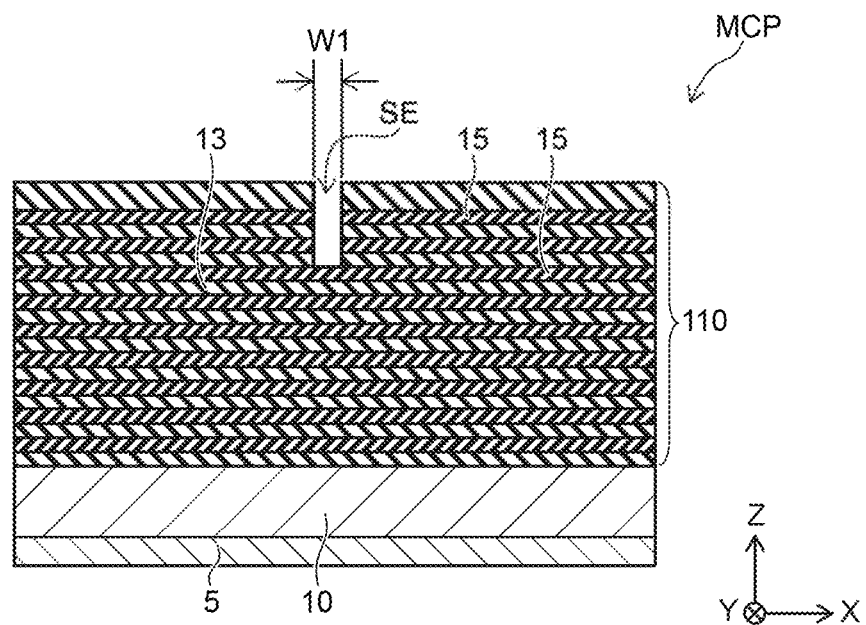
Figure 6B:
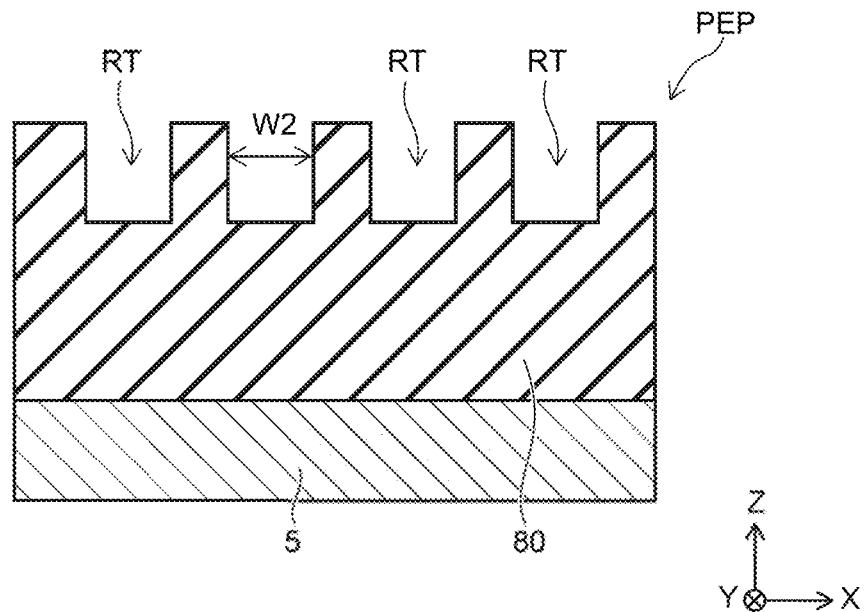

FIG. 6A shows a partial cross-section of the memory cell portion MCP, and FIG. GB is a schematic view showing a partial cross-section of the peripheral portion PEP. Hereinafter, FIGS. 7A, 7B, 9A to 13B are shown in the same manner.

As shown in FIG. 6A, the trench SE is formed in the memory cell portion MCP, the trench SE extending downward from the top surface of the stacked body 110. The trench SE also extends in the Y-direction. The trenches RT are formed in the peripheral portion PEP, the trenches RT extending downward from the top surface of the insulating layer 80. The trenches RT also extend, for example, in the Y-direction. The trenches SE and RT are simultaneously formed, for example, using Reactive Ion Etching (RIE).

As shown in FIG. 6A, the trench SE divides at least one of the insulating layers 15, and is formed so as to expose an insulating layer 13 at the bottom surface thereof. In this example, the trench SE divides three insulating layers 15. Moreover, the width $W_2$ in the X-direction of the trenches RT is formed to be larger than the width $W_1$ in the X-direction of the trench SE.

Figure 7A:
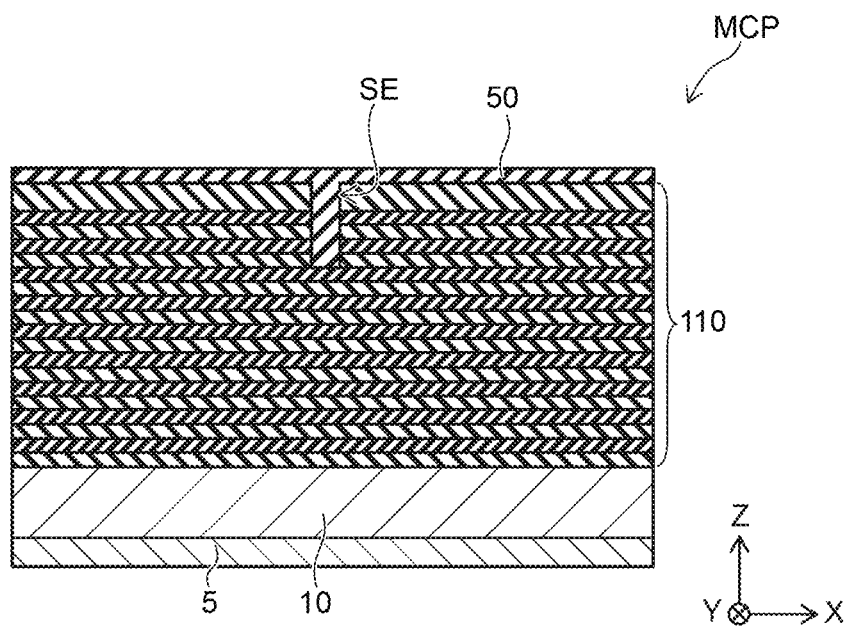
Figure 7B:
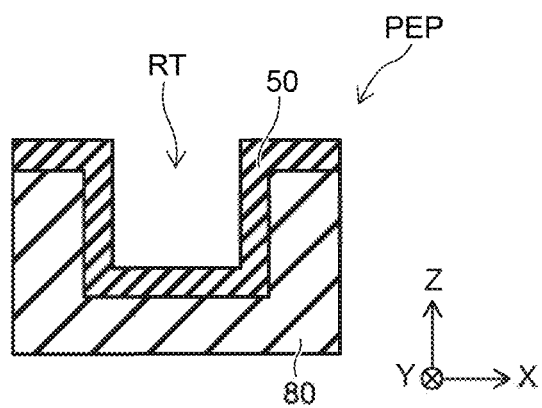

As shown in FIG. 7A, an insulating layer 50 is formed to cover the surface of the stacked body 110 in the memory cell portion MCP and to be embedded in the trench SE. The insulating layer 50 also covers the top surface of the insulating layer 80 and the inner surface of the trenches RT in the peripheral portion PEP as shown in FIG. 7B. The insulating layer 50 is, for example, a silicon oxide layer formed using CVD.

In the embodiment, whereas the inside of the trench SE is completely filled with the insulating layer 50 as shown in FIG. 7A, the inside of the trench RT is not filled with the insulating layer 50 as shown in FIG. 7B, the insulating layer 50 with the prescribed thickness being formed along the inner wall of the trench RT. That is, the width W1 of the trench SE and the width W2 of the trench RT are set so that a space for forming the resistive body 90 is left inside the trench RT after the insulating layer 50 is formed.

Figure 8:
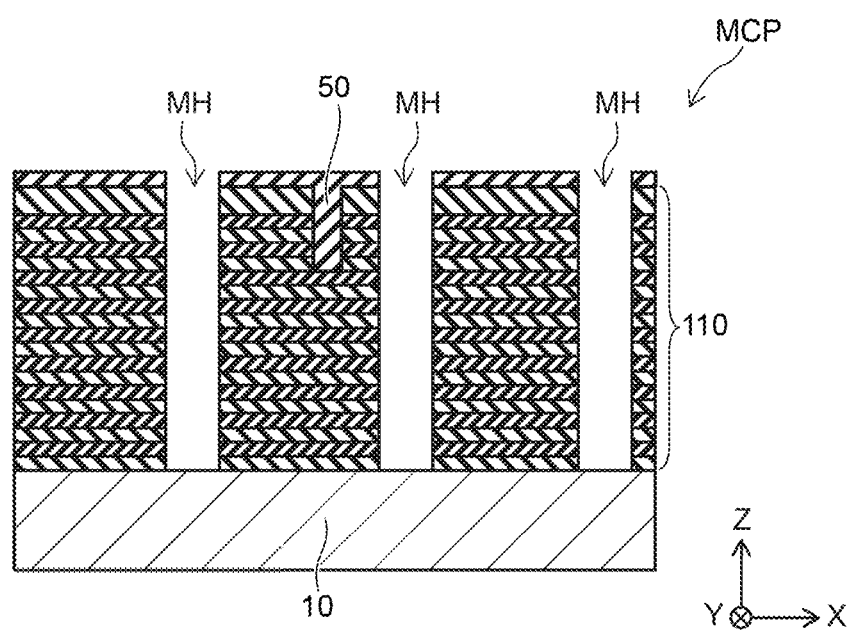

FIG. 8 is a schematic view showing a partial cross-section of the memory cell portion MCP. Hereinafter, FIGS. 14 to 17 are shown in the same manner.

As shown in FIG. 8, memory holes MH are formed in the memory cell portion MCP from the top surface of the stacked body 110 with a depth capable of reaching the source layer 10. The memory holes MH are formed by selectively removing the insulating layers 13 and 15, for example, using anisotropic RIE. The source layer 10 is exposed at the bottoms of the memory holes MH.

Figure 9A:
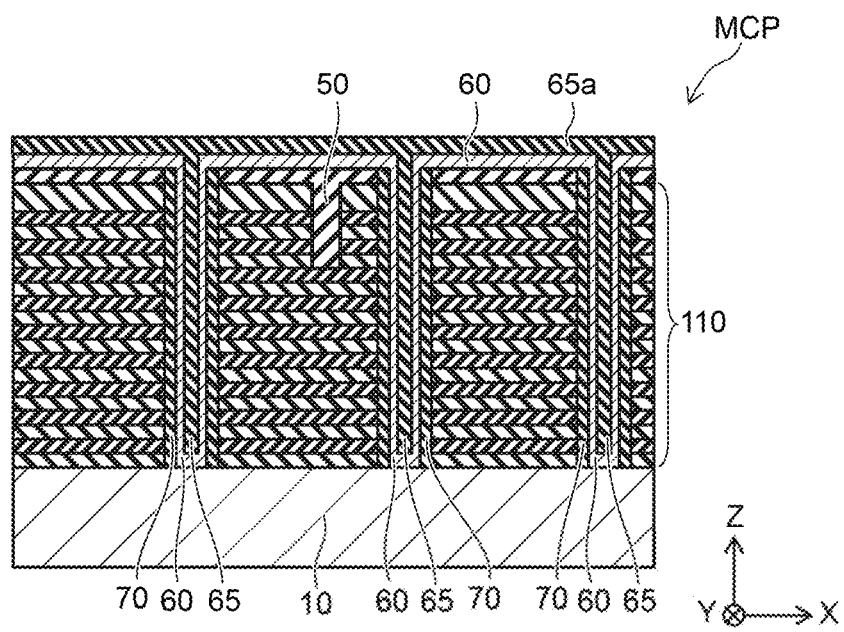
Figure 9B:
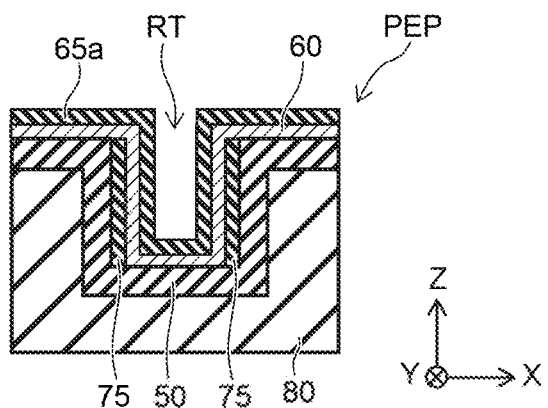

As shown in FIG. 9A, the insulating layer 70 is formed on an inner wall of each memory hole MH. The insulating layer 70 includes the first layer 71, the second layer 72 and the third layer 73 (see FIG. 2B), which are stacked sequentially on the inner wall of the memory hole MH. In the forming process of the insulating layer 70, the first layer 71, the second layer 72 and the third layer 73 are sequentially formed, for example, so as to cover the inner walls of the memory holes MH and the top surface of the stacked body 110, and then, parts of the insulating layer 70 provided on the bottoms of the memory holes MH are removed using the anisotropic RIE, leaving parts provided on the inner walls of the memory holes MH. Moreover, in the peripheral portion PEP, the insulating layer 75 is provided at the same time on the wall surface of the trench RT as shown in FIG. 9B. The insulating layer 75 has the same stacked structure with the insulating layer 70. The space for forming the resistive body 90 is held in the trench RT after the insulating layer 75 is formed.

Further, a semiconductor layer 60 is formed to cover the inner surfaces of the memory holes MH and the top surface of the stacked body 110 in the memory cell portion MCP. Then, an insulating layer 65a is formed to fill the inside of the memory holes MH and to cover the top surface of the stacked body 110. At the same time, the semiconductor layer 60 and the insulating layer 65a cover the top surface of the insulating layer 80 and the inner surfaces of the trenches RT in the peripheral portion PEP. The semiconductor layer 60 is, for example, a silicon layer formed using CVD. The insulating layer 65a is, for example, a silicon oxide layer formed using CVD.

Figure 10A:
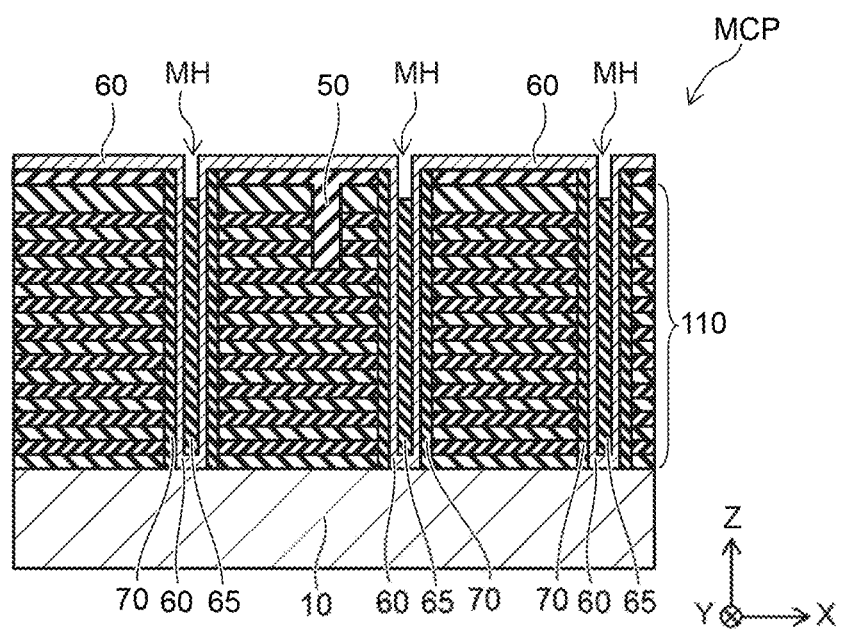
Figure 10B:
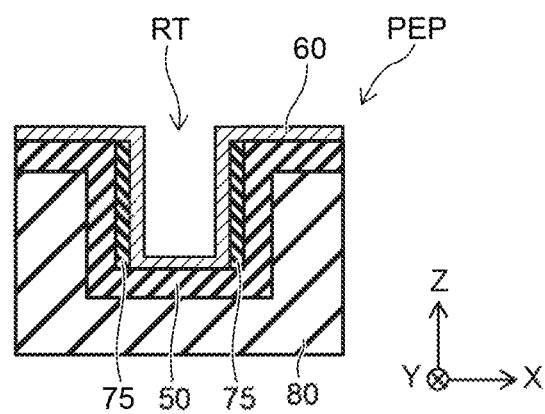

As shown in FIG. 10A, core bodies 65 are formed in the memory holes MH by removing a part of the insulating layer 65a, for example, using RIE, which covers the top surface of the stacked body 110. The insulating layer 65a is also etched back so as to form spaces on the core bodies 65 in the memory holes MH. In this process, the insulating layer 65a formed on the semiconductor layer 60 is removed in the peripheral portion PEP shown in FIG. 10B.

Figure 11A:
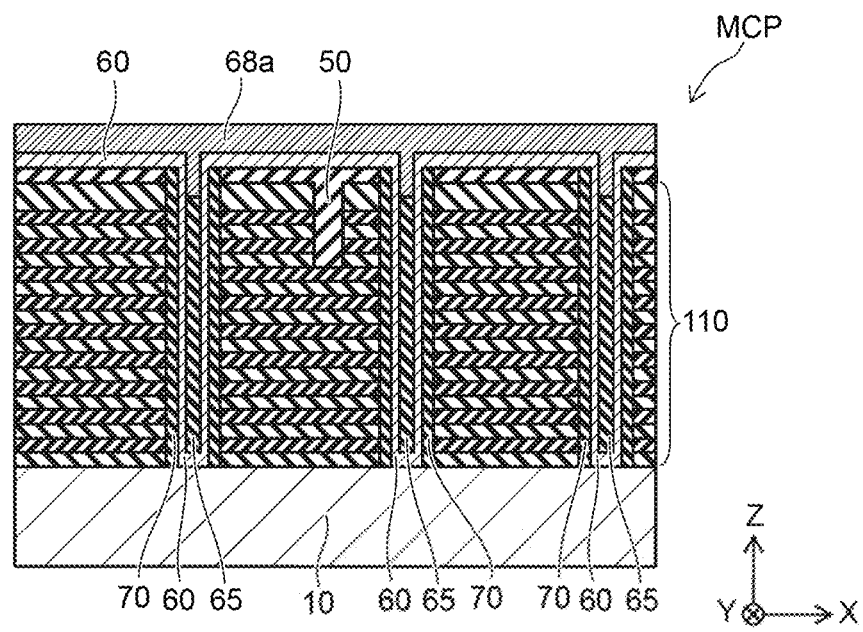
Figure 11B:
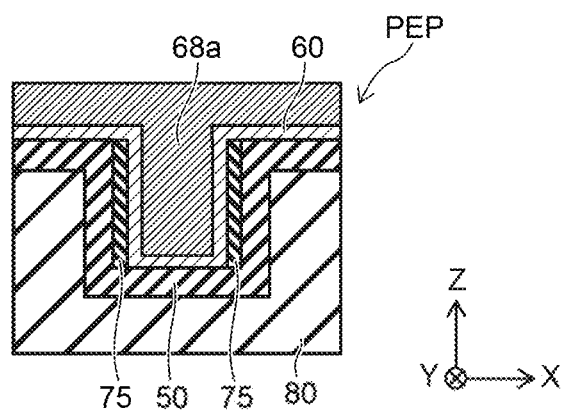

As shown in FIG. 11A, a semiconductor layer 68a is formed to fill the spaces on the core bodies 65. The semiconductor layer 68a is, for example, a conductive amorphous silicon layer formed using CVD. In this process, another part of the semiconductor layer 68a fills the inside of the trench RT in the peripheral portion PEP shown in FIG. 11B.

Figure 12A:
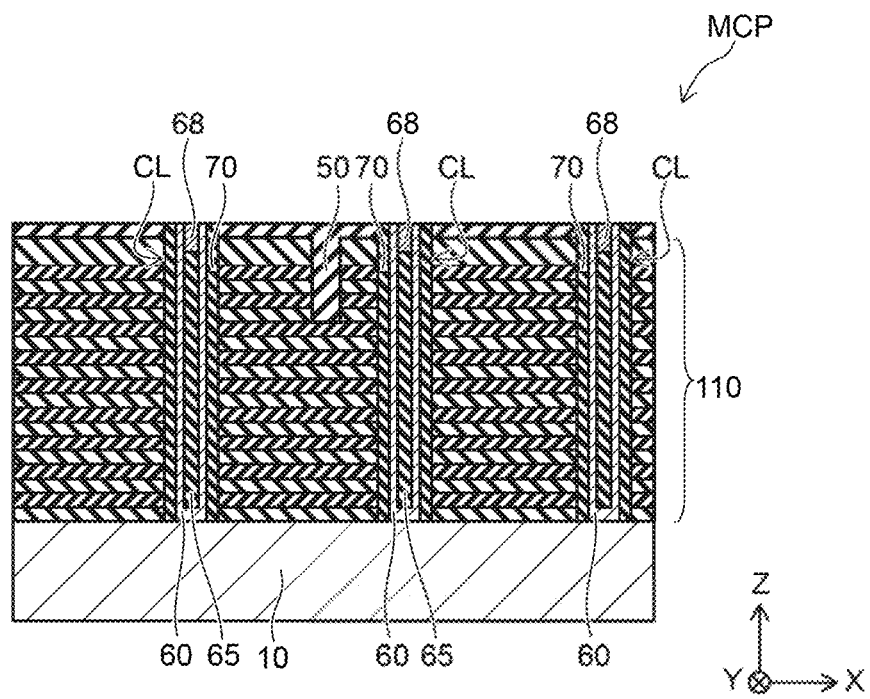
Figure 12B:
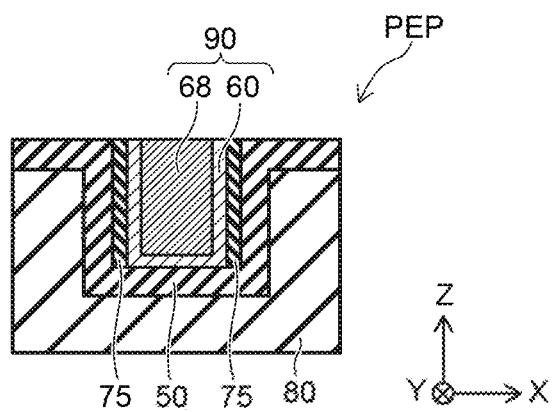

As shown in FIG. 12A, cap layers 68 are formed on the core bodies 65 by removing the semiconductor layer 60 and the semiconductor layer 68a using RIE, which are formed on the stacked body 110. The cap layers 68 are parts of the semiconductor layer 68a which are embedded in the spaces on the core bodies 65. In this process, the semiconductor layers 60 and 68a are also removed in the peripheral portion PEP shown in 12B, leaving a part embedded in the trench RT. Thus, the columnar bodies CL are formed in the memory cell portion MCP, and the resistive body 90 is formed in the trench RT in the peripheral portion PEP. The resistive body 90 includes the parts of the semiconductor layers 60 and 68a.

Figure 13A:
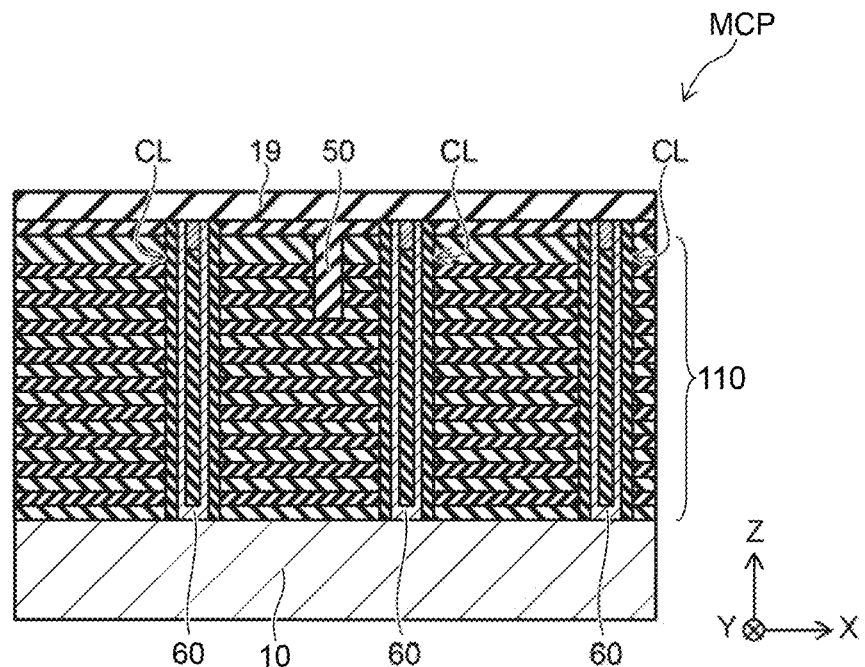
Figure 13B:
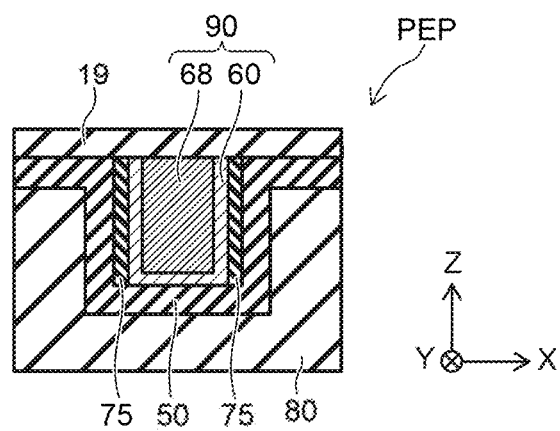

As shown in FIG. 13A, an insulating layer 19 is formed to cover the columnar bodies CL and the insulating layer 50 in the memory cell portion MCP. The insulating layer 19 is, for example, a silicon oxide layer formed using CVD. As shown in FIG. 13B, the insulating layer 19 covers the insulating layer 50 and the resistive body 90 in the peripheral portion PEP.

Figure 14:
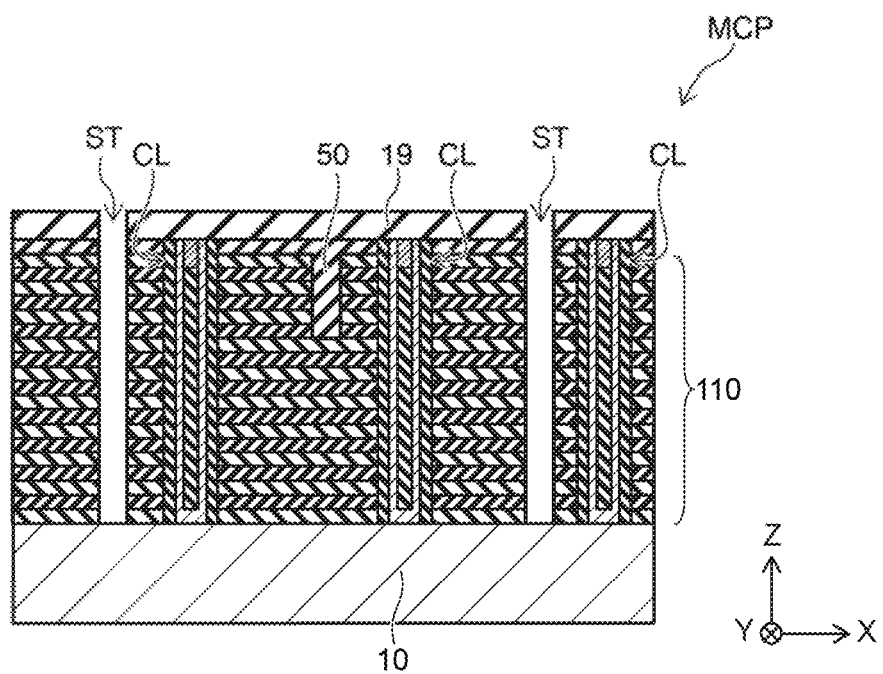

As shown in FIG. 14, slits ST are formed from the top surface of the insulating layer 19 with a depth capable of reaching the source layer 10. The slits ST are formed, for example, using anisotropic RIE, and also extend in the Y-direction. The slits ST divide the stacked body 110 into a plurality of portions each including a plurality of memory holes.

Figure 15:
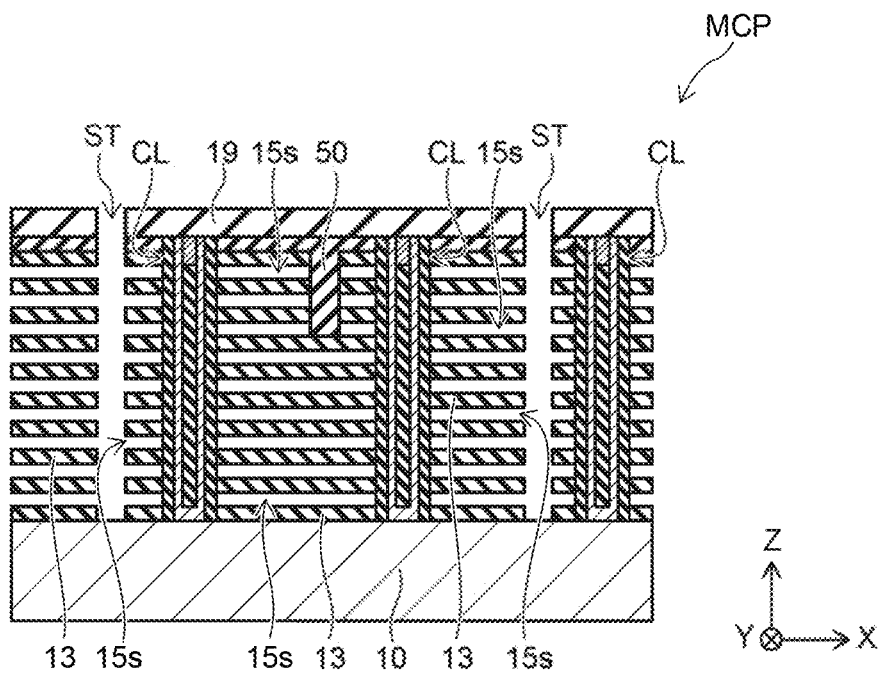

As shown in FIG. 15, the insulating layers 15 are selectively removed by supplying etching liquid through the slits ST. In the case where the insulating layers 13 are silicon oxide layers, and the insulating layers 15 are silicon nitride layers; it is possible to selectively remove the insulating layers 15 by supplying hot phosphoric acid as the etching liquid.

Figure 16:
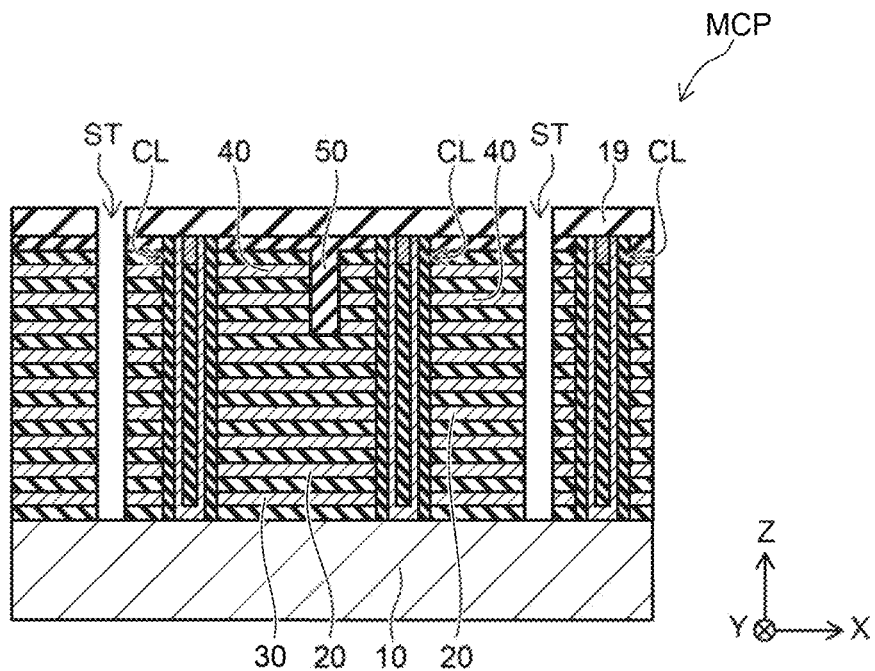

As shown in FIG. 16, the word lines 20, the selection gates 30 and 40 are formed in the spaces 15s (see FIG. 15) where the insulating layers 15 are removed. The word lines 20, the selection gates 30 and 40 include, for example, tungsten layers formed using CVD. Moreover, the word lines 20 and the selection gate 30 may respectively include, for example, barrier metal such as titanium nitride (TiN) positioned between a tungsten layer and an insulating layer 13 and between the tungsten layer and a columnar body CL.

Figure 17:
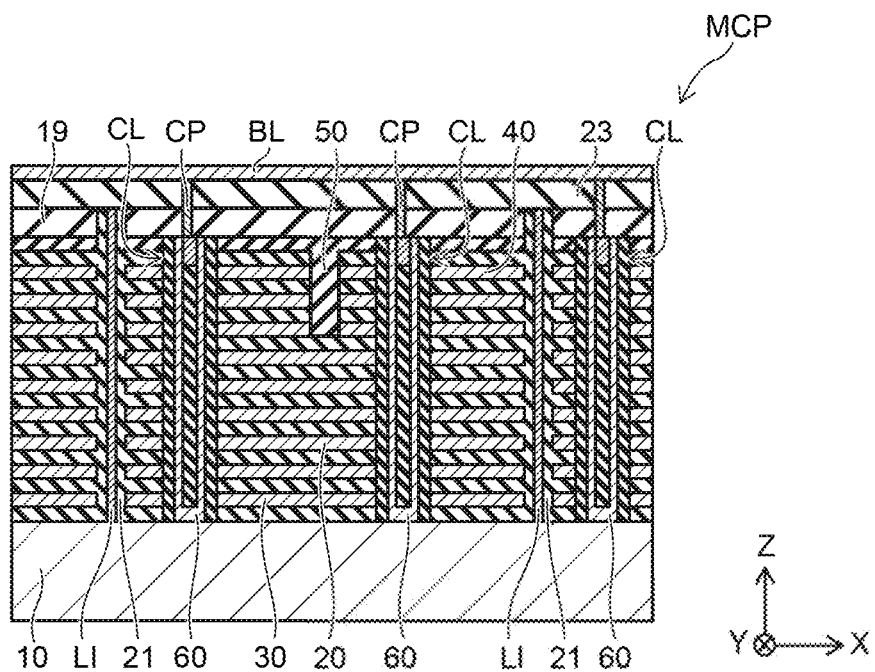

As shown in FIG. 17, source contact bodies LI are formed in the slits SL. The source contact bodies LI are, for example, tungsten layers formed using CVD, and electrically connected to the source layer 10. The source contact layers LI are electrically isolated via insulating layers 21 from the word lines 20, the selection gates 30 and 40. The insulating layers 21 are, for example, silicon oxide layers formed using CVD.

Subsequently, the source line SL (see FIG. 1) is formed so as to be electrically connected to the source contact bodies LI; and then, an insulating layer 23 is formed on the insulating layer 19. Furthermore, the bit lines BL (see FIG. 1) are formed on the insulating layer 23. The bit lines BL are electrically connected via contact plugs CP to the semiconductor layers 60. Thus, the semiconductor memory device 1 shown in FIGS. 2A to 2C is completed.

As described above, the resistive bodies 90 are formed in the peripheral portion PEP together with the formation process of the memory cell portion MCP through the manufacturing process of the semiconductor memory device 1. That is, in the embodiment, it is possible to form the resistive elements of the peripheral circuits without adding another process to the formation process of the memory cell portion MCP. Thus, it is possible to make Turnaround Time (TAT) shorter in the manufacturing process of the semiconductor memory device 1, and to reduce the manufacturing cost thereof.

Moreover, in the embodiment, the resistive bodies 90 may be formed at the final step of the formation process of the memory cell portion MCP. Thus, it is possible to avoid the change of resistivity due to the thermal treatments under high temperature, which are carried out after the stacked body 110 is formed, and the insulating layers 70 and the semiconductor layers 60 are formed in the memory holes MH. Furthermore, when the resistive elements are formed in the same process with the peripheral circuits, the doping amount of impurities into the resistive bodies may be restricted in order to suppress the influence on other circuit elements. In the embodiment, since the resistive bodies 90 are configured by the parts of the semiconductor layer 60 and 65a, and thus, there are less restrictions of the doping; controlling the resistivity thereof is easier.

Figure 18:
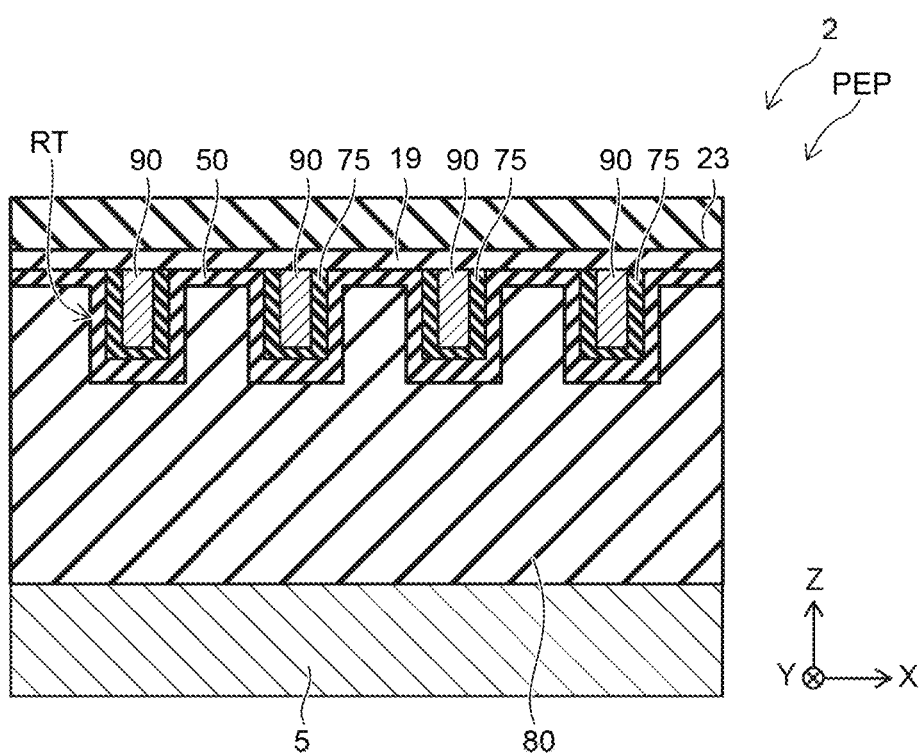
FIG. 18 is a schematic cross-sectional view showing a part of a semiconductor memory device according to a variation of the embodiment.

FIG. 18 is a schematic cross-sectional view showing the peripheral portion PEP of a semiconductor memory device 2 according to a variation of the embodiment. In this example, the insulating layer 75 is provided between the insulating layer 80 and the lateral surface of the resistive body 90 and between the insulating layer 80 and the bottom of the resistive body 90. That is, the insulating layer 75 remains through the process shown in FIGS. 9A and 9B so as to cover the inner surface of the trenches RT. This may be achieved by forming an insulating layer that protects the top surfaces of the stacked body 110 and the insulating layer 80 through the process of selectively removing the parts of the first layer 71, the second layer 72 and the third layer 73, which are formed on the bottoms of the memory holes MH.

Figure 19A:
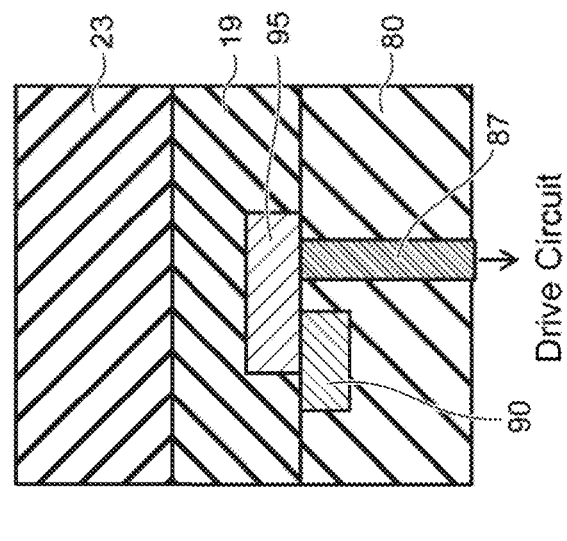
FIGS. 19A to 19C are schematic cross-sectional view showing another part of the semiconductor memory device according to the embodiment.
Figure 19B:
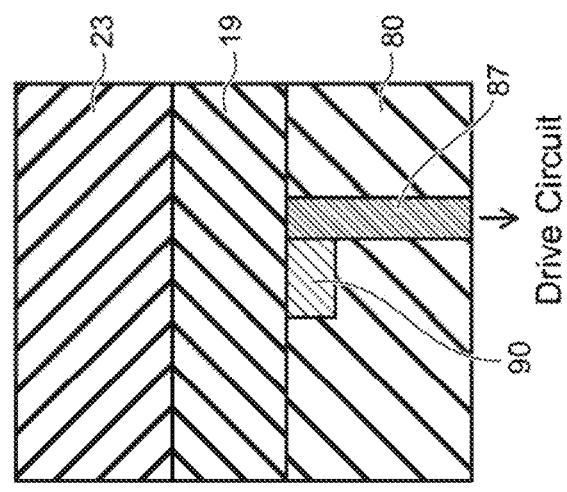
Figure 19C:
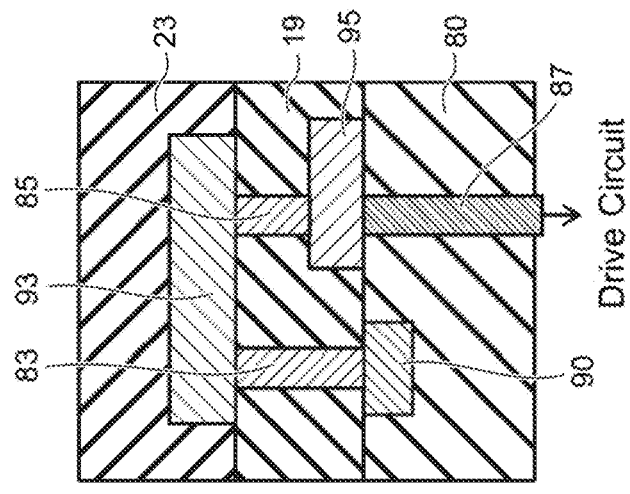

FIGS. 19A to 19C are schematic cross-sectional views showing another parts of the semiconductor memory device 1 and 2 according to the embodiment. FIGS. 19A to 19C are schematic views showing electrically connecting method, for example, between a driving circuit (not shown) of the semiconductor memory device and resistive body 90.

In FIG. 19A, shown is the connecting method through interconnections 93 and 95 between the resistive body 90 and the driving circuit. The interconnection 93 is provided between the insulating layers 19 and 23, and includes a portion positioned above the resistive body 90. The interconnection 95 is provided between the insulating layers 19 and 80 at a position away from the resistive body 90 in the X-direction.

The resistive body 90 is electrically connected through a contact plug 83 to the portion of the interconnection 93 positioned thereabove. The interconnection 95 is electrically connected through a contact plug 85 to another portion of the interconnection 93 positioned thereabove. The interconnection 95 is electrically connected to the driving circuit through a contact plug 87 positioned directly therebelow. Thus, the resistive body 90 is electrically connected to the driving circuit away therefrom, for example, in the X-direction through the interconnection provided thereabove.

In the example shown in FIG. 19B, the resistive body 90 is electrically connected through the contact plug 87 to an interconnection of the driving circuit positioned therebelow. The resistive body 90 is electrically connected at the lateral surface thereof to the contact plug 87.

In the example shown in FIG. 19C, the resistive body 90 is electrically connected to the driving circuit away therefrom, for example, in the X-direction through the interconnection 95 and the contact plug 87. The resistive body 90 is directly connected at the top surface thereof to the interconnection 95.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a plurality of first electrode layers stacked in a first direction;
   a semiconductor layer extending in the first direction in the plurality of first electrode layers;
   a first insulating layer extending in the first direction along the semiconductor layer between the semiconductor layer and each of the plurality of first electrode layers;
   a second insulating layer covering a periphery of the plurality of first electrode layers;
   a resistive body provided on the second insulating layer; and
   a third insulating layer provided between the resistive body and the second insulating layer, the third insulating layer including a material same as a material of the first insulating layer.

2. The semiconductor memory device according to claim 1, wherein
   the first insulating layer has a stacked structure including a plurality of insulating layers, and
   the third insulating layer has the same stacked structure as the stacked structure of the first insulating layer.

3. The semiconductor memory device according to claim 2, wherein
   the first insulating layer and the third insulating layer includes a first layer containing silicon oxide, a second layer containing silicon nitride and a third layer containing silicon oxide.

4. The semiconductor memory device according to claim 1, wherein
   the resistive body includes silicon.

5. The semiconductor memory device according to claim 1, further comprising:
   a conductive layer electrically connected to the semiconductor layer, wherein
   the plurality of first electrode layers are stacked on the conductive layer, and
   the resistive body extends in a second direction along a surface of the conductive layer.

6. The semiconductor memory device according to claim 1, wherein
   the resistive body has a top surface, a bottom surface and a lateral surface connected to the top surface and the bottom surface, and
   the third insulating layer is provided between the second insulating layer and the lateral surface.

7. The semiconductor memory device according to claim 1, wherein
   the resistive body has a top surface, a bottom surface and a lateral surface connected to the top surface and the bottom surface, and
   the third insulating layer is provided between the second insulating layer and the lateral surface and between the second insulating layer and the bottom surface.

8. The semiconductor memory device according to claim 1, further comprising:
   a fourth insulating layer provided between the second insulating layer and the third insulating layer, the fourth insulating layer including silicon oxide.

9. The semiconductor memory device according to claim 1, wherein
   the second insulating layer is provided in a groove adjacent to the plurality of first electrode layers.

* * * * *